(12) United States Patent
Kobayashi et al.

(10) Patent No.: US 11,756,774 B2
(45) Date of Patent: Sep. 12, 2023

(54) PLASMA PROCESSING APPARATUS

(71) Applicant: Tokyo Electron Limited, Tokyo (JP)

(72) Inventors: Toshimasa Kobayashi, Miyagi (JP); Kazuki Takahashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 461 days.

(21) Appl. No.: 16/939,076

(22) Filed: Jul. 27, 2020

(65) Prior Publication Data
US 2021/0043434 A1 Feb. 11, 2021

(30) Foreign Application Priority Data
Aug. 5, 2019 (JP) .................. 2019-143731

(51) Int. Cl.
*H01J 37/32* (2006.01)
*B01D 53/04* (2006.01)

(52) U.S. Cl.
CPC .... *H01J 37/32844* (2013.01); *B01D 53/0407* (2013.01); *H01J 37/3244* (2013.01); *H01J 37/32229* (2013.01); *H01J 37/32871* (2013.01); *B01D 2253/34* (2013.01); *H01J 37/32311* (2013.01)

(58) Field of Classification Search
CPC .......... H01J 37/32311; H01J 37/32844; H01J 37/32229; H01J 37/3244; H01J 37/32871; B01D 53/0407; B01D 2253/34
See application file for complete search history.

(56) References Cited

U.S. PATENT DOCUMENTS

| | | | |
|---|---|---|---|
| 6,692,903 B2 * | 2/2004 | Chen ................. | H01L 21/32136 430/329 |
| 10,109,463 B2 * | 10/2018 | Kaneko ............. | H01J 37/32229 |
| 2016/0268101 A1 * | 9/2016 | Kaneko ............. | H01J 37/32917 |
| 2021/0280401 A1 * | 9/2021 | Hirayama .......... | H01J 37/32311 |

FOREIGN PATENT DOCUMENTS

| | | |
|---|---|---|
| JP | 8-203868 A | 8/1996 |
| JP | 8-213360 A | 8/1996 |
| JP | 8-321492 A | 12/1996 |
| JP | 2004-79806 A | 3/2004 |
| JP | 2010-10304 A | 1/2010 |
| JP | 2016-170940 A | 9/2016 |

* cited by examiner

*Primary Examiner* — Gonzalo Laguarda
(74) *Attorney, Agent, or Firm* — XSENSUS LLP

(57) ABSTRACT

A plasma processing apparatus includes: a processing container in which a mounting stage mounted with a substrate is provided and a plasma process is performed on the substrate; an exhaust passage which is provided around the mounting stage and through which a gas containing a by-product released by the plasma process flows; and a first adsorption member which is arranged along an inner wall surface of the exhaust passage and of which a surface is roughened to adsorb the by-product.

6 Claims, 7 Drawing Sheets

PLASMA PROCESSING APPARATUS

CROSS-REFERENCE TO RELATED APPLICATIONS

The present application claims priority to and incorporates by reference the entire contents of Japanese Patent Application No. 2019-143731 filed in Japan on Aug. 5, 2019.

FIELD

The present disclosure relates to a plasma processing apparatus.

BACKGROUND

Japanese Laid-open Patent Publication No. 2016-170940 discloses a plasma processing apparatus in which an exhaust passage through which exhausted gas flows is provided around a mounting stage on which a substrate is placed.

The present disclosure provides a technique capable of suppressing adhesion of by-products to the inner wall surface of the exhaust passage.

SUMMARY

According to an aspect of a present disclosure, a plasma processing apparatus includes, a processing container, an exhaust passage, and a first adsorption member. A mounting stage mounted with a substrate is provided in the processing container. A plasma process is performed on the substrate in the processing container. The exhaust passage is provided around the mounting stage and a gas containing a by-product released by the plasma process flows through the exhaust passage. The first adsorption member is arranged along an inner wall surface of the exhaust passage and a surface of the first adsorption member is roughened to adsorb the by-product.

DESCRIPTION OF EMBODIMENTS

Figure 1:
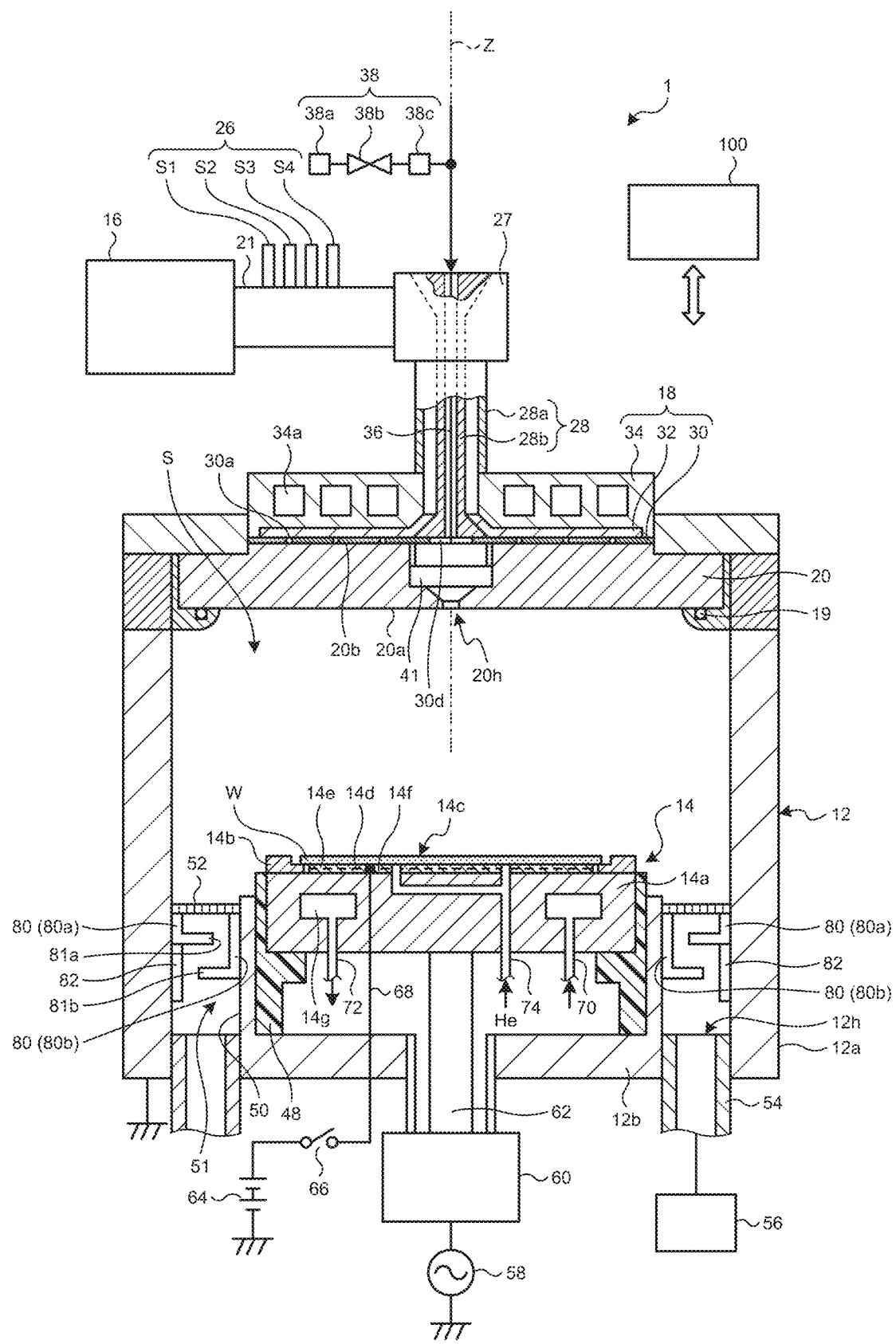
FIG. 1 is a diagram illustrating an example of a schematic configuration of a plasma processing apparatus according to a first embodiment.

Hereinafter, various embodiments will be described in detail with reference to the drawings. Incidentally, in each drawing, the same or corresponding units are designated by the same reference numerals.

Incidentally, in a plasma processing apparatus, when a substrate is placed on a mounting stage, and a plasma process is performed on the substrate, a by-product is released by the plasma process. For example, when an etching process by plasma is performed on a substrate containing metal, a by-product containing metal is released. The gas containing the released by-product flows through an exhaust passage provided around the mounting stage. At this time, some of the by-products contained in the gas may adhere to the inner wall surface of the exhaust passage. In the plasma processing apparatus, when a large amount of by-products adheres to the inner wall surface of the exhaust passage, it takes time to remove the by-products, which may reduce maintainability and operating rate. In this regard, it is expected to suppress adhesion of by-products to the inner wall surface of the exhaust passage.

First Embodiment

Configuration of Plasma Processing Apparatus

FIG. 1 is a diagram illustrating an example of a schematic configuration of a plasma processing apparatus 1 according to a first embodiment. The plasma processing apparatus 1 illustrated in FIG. 1 includes a chamber (processing container) 12 and a microwave output device 16. The plasma processing apparatus 1 is configured as a microwave plasma processing apparatus which excites gas with microwaves. The plasma processing apparatus 1 has a mounting stage 14, an antenna 18, and a dielectric window 20.

The chamber 12 provides a processing space S therein. The chamber 12 has a side wall 12a and a bottom portion 12b. The side wall 12a is formed in a substantially tubular shape. The central axial line of the side wall 12a substantially coincides with an axial line Z extending in a vertical direction. The bottom portion 12b is provided on the lower end side of the side wall 12a. The bottom portion 12b is provided with an exhaust hole 12h for exhaust. Further, the upper end of the side wall 12a is open.

The dielectric window 20 is provided on the upper end of the side wall 12a. The dielectric window 20 has a lower surface 20a facing the processing space S. The dielectric window 20 closes the opening at the upper end of the side wall 12a. An O-ring 19 is interposed between the dielectric window 20 and the upper end of the side wall 12a. The O-ring 19 provides a more reliable seal for the chamber 12.

The mounting stage 14 is housed in the processing space S. The mounting stage 14 is provided so as to face the dielectric window 20 in the vertical direction. Further, the mounting stage 14 is provided so that the processing space S is sandwiched between the dielectric window 20 and the mounting stage 14. The mounting stage 14 is configured to support a wafer W which is a processing target substrate placed on the mounting stage.

The mounting stage 14 includes a base 14a and an electrostatic chuck 14c. The base 14a has a substantially disc shape and is made of a conductive material such as aluminum. The central axial line of the base 14a substantially coincides with the axial line Z. The base 14a is supported by a tubular support unit 48. The tubular support unit 48 is made of an insulating material and extends vertically upward from the bottom portion 12b. The tubular support unit 48 is formed so as to cover the peripheral portion of the lower surface from the side surface of the mounting stage 14. A conductive tubular support unit 50 is provided on the outer periphery of the tubular support unit 48. The tubular support unit 50 extends vertically upward from the bottom portion 12b of the chamber 12 along the outer periphery of the tubular support unit 48. The tubular support unit 50 is formed so as to cover the side surface of the mounting stage 14.

The base 14a also serves as a high frequency electrode. A high frequency power supply 58 for RF bias is electrically connected to the base 14a via a power feed rod 62 and a matching unit 60. The high frequency power supply 58 outputs a constant frequency suitable for controlling the energy of the ions drawn to the wafer W, for example, a high frequency of 13.65 MHz (hereinafter, appropriately referred to as "bias high frequency") with a set power. The matching unit 60 is an impedance matching device for performing impedance matching between the high frequency power supply 58 and loads such as electrodes, plasma, and the chamber 12.

An electrostatic chuck 14c is provided on the upper surface of the base 14a. The electrostatic chuck 14c holds the wafer W by electrostatic adsorption. The electrostatic chuck 14c includes an electrode 14d, an insulating film 14e, and an insulating film 14f, and has a substantially disc shape. The central axial line of the electrostatic chuck 14c substantially coincides with the axial line Z. The electrode 14d of the electrostatic chuck 14c is made of a conductive film, and is provided between the insulating film 14e and the insulating film 14f. A DC power supply 64 is electrically connected to the electrode 14d via a switch 66 and a covered wire 68. The electrostatic chuck 14c can adsorb and hold the wafer W by the Coulomb force generated by the DC voltage applied from the DC power supply 64. Further, a focus ring 14b is provided on the base 14a. The focus ring 14b is arranged so as to surround the wafer W and the electrostatic chuck 14c.

A refrigerant chamber 14g is provided inside the base 14a. The refrigerant chamber 14g is formed so as to extend around the axial line Z, for example. The refrigerant from the chiller unit is supplied to the refrigerant chamber 14g through a pipe 70. The refrigerant supplied to the refrigerant chamber 14g is returned to a chiller unit via a pipe 72. The temperature of the refrigerant is controlled by the chiller unit, so that the temperature of the electrostatic chuck 14c and thus the temperature of the wafer W is controlled.

A gas supply line 74 is formed on the mounting stage 14. The gas supply line 74 is provided to supply heat transfer gas, for example, He gas, between the upper surface of the electrostatic chuck 14c and the back surface of the wafer W.

The microwave output device 16 generates a microwave having a power according to the set power. The microwave output device 16 outputs, for example, a microwave of a single frequency, that is, a single peak (SP) for exciting the processing gas supplied into the chamber 12. The microwave output device 16 is configured to variably adjust the frequency and power of the microwave. In one example, the microwave output device 16 can adjust the microwave power in the range of 0 W to 5000 W and can adjust the microwave frequency in the range of 2400 MHz to 2500 MHz.

The plasma processing apparatus 1 further includes a waveguide 21, a tuner 26, a mode converter 27, and a coaxial waveguide 28. The waveguide 21 and the coaxial waveguide 28 are waveguides which guide the microwave generated by the microwave output device 16 to the antenna 18 (to be described later) of the chamber 12. The output unit of the microwave output device 16 is connected to one end of the waveguide 21. The other end of the waveguide 21 is connected to the mode converter 27. The waveguide 21 is, for example, a rectangular waveguide. The tuner 26 is provided in the waveguide 21. The tuner 26 has movable short-circuit plates S1 to S4. Each of the movable short-circuit plates S1 to S4 is configured such that the amount of protrusion thereof with respect to the internal space of the waveguide 21 can be adjusted. The tuner 26 matches the impedance of the microwave output device 16 with the load, for example, the impedance of the chamber 12 by adjusting the protruding position of each of the movable short-circuit plates S1 to S4 with respect to a predetermined reference position.

The mode converter 27 converts the mode of the microwave from the waveguide 21 and supplies the mode-converted microwave to the coaxial waveguide 28. The coaxial waveguide 28 includes an outer conductor 28a and an inner conductor 28b. The outer conductor 28a has a substantially cylindrical shape, and the central axial line thereof substantially coincides with the axial line Z. The inner conductor 28b has a substantially cylindrical shape, and extends inside the outer conductor 28a. The central axial line of the inner conductor 28b substantially coincides with the axial line Z. The coaxial waveguide 28 transmits the microwave from the mode converter 27 to the antenna 18.

The antenna 18 is provided on a surface 20b of the dielectric window 20 opposite to the lower surface 20a. The antenna 18 includes a slot plate 30, a dielectric plate 32, and a cooling jacket 34.

The slot plate 30 is provided on the surface 20b of the dielectric window 20. The slot plate 30 is made of a conductive metal and has a substantially disc shape. The central axial line of the slot plate 30 substantially coincides with the axial line Z. A plurality of slot holes 30a are formed in the slot plate 30. The plurality of slot holes 30a configure a plurality of slot pairs in one example. Each of the plurality of slot pairs includes two slot holes 30a which have a substantially oblong hole shape and extend in a direction intersecting with each other. The plurality of slot pairs are arranged along one or more concentric circles around the axial line Z. Further, a through hole 30d through which a conduit 36 (to be described later) can pass is formed in the central portion of the slot plate 30.

The dielectric plate 32 is provided on the slot plate 30. The dielectric plate 32 is made of a dielectric material such as quartz and has a substantially disc shape. The central axial line of the dielectric plate 32 substantially coincides with the axial line Z. The cooling jacket 34 is provided on the dielectric plate 32. The dielectric plate 32 is provided between the cooling jacket 34 and the slot plate 30.

The surface of the cooling jacket 34 has conductivity. A flow path 34a is formed inside the cooling jacket 34. A refrigerant is supplied to the flow path 34a. The lower end of the outer conductor 28a is electrically connected to the upper surface of the cooling jacket 34. Further, the lower end of the inner conductor 28b is electrically connected to the slot plate 30 through a hole formed in the central portion of the cooling jacket 34 and the dielectric plate 32.

The microwave from the coaxial waveguide 28 propagates in the dielectric plate 32 and is supplied to the dielectric window 20 through the plurality of slot holes 30a of the slot plate 30. The microwave supplied to the dielectric window 20 is introduced into the processing space S.

A conduit 36 passes through the inner hole of the inner conductor 28b of the coaxial waveguide 28. Further, as described above, the through hole 30d through which the conduit 36 can pass is formed in the central portion of the slot plate 30. The conduit 36 extends through the inner hole of the inner conductor 28b and is connected to a gas supply system 38.

The gas supply system 38 supplies a processing gas for processing the wafer W to the conduit 36. The gas supply system 38 may include a gas source 38a, a valve 38b, and a flow volume controller 38c. The gas source 38a is a gas source of the processing gas. The valve 38b switches between supply and supply stop of the processing gas from the gas source 38a. The flow volume controller 38c is, for example, a mass flow controller, and adjusts the flow volume of the processing gas from the gas source 38a.

The plasma processing apparatus 1 may further include an injector 41. The injector 41 supplies the gas from the conduit 36 to a through hole 20h formed in the dielectric window 20. The gas supplied to the through hole 20h of the dielectric window 20 is supplied to the processing space S. Then, the processing gas is excited by the microwaves introduced into the processing space S from the dielectric window 20. As a result, plasma is generated in the processing space S, and the wafer W placed on the mounting stage 14 is processed by active species such as ions and/or radicals from the plasma.

An exhaust passage 51 is provided around the mounting stage 14. The exhaust passage 51 is formed around the entire circumference of the mounting stage 14. For example, an annular exhaust passage 51 is formed between the side surface of the mounting stage 14 and the side surface of the chamber 12.

A baffle plate 52 is provided above the exhaust passage 51. The baffle plate 52 has a ring shape. The baffle plate 52 is formed with a plurality of through holes penetrating the baffle plate 52 in a plate thickness direction, and exhausted gas can pass therethrough. The exhaust passage 51 communicates with an exhaust hole 12h provided in the bottom portion 12b of the chamber 12. An exhaust device 56 is connected to the exhaust hole 12h via an exhaust pipe 54. The exhaust device 56 has an automatic pressure control valve (APC) and a vacuum pump such as a turbo molecular pump. Then, the chamber 12 is evacuated by the exhaust device 56, and the processing space S can be depressurized to a desired degree of vacuum during the plasma process. As a result, the gas in the chamber 12 flows through the exhaust passage 51 toward the exhaust hole 12h and is exhausted from the exhaust hole 12h. The gas flowing through the exhaust passage 51 contains the by-products which are released by the plasma process performed in the chamber 12.

In the exhaust passage 51, a plurality of first adsorption members 80 are arranged along the inner wall surface of the exhaust passage 51. In the present embodiment, the first adsorption member 80 is configured by a first component 80a and a second component 80b. The second component 80b is arranged along the inner wall surface of the exhaust passage 51 on the side surface side of the mounting stage 14, and the first component 80a is arranged along the inner wall surface on the side surface side of the chamber 12. The surface of the first adsorption member 80 is roughened to adsorb by-products. Examples of roughening include thermal spraying, blasting, and laser processing. The surface of the first adsorption member 80 has a planar portion which protrudes in a direction intersecting the gas flow in the exhaust passage 51, and the roughening is performed on the surface of the first adsorption member 80 and the surface of the planar portion on the upstream side of the gas flow of the exhaust passage 51. In the present embodiment, the first component 80a has a planar portion 81a on the surface, the second component 80b has a planar portion 81b on the surface, and the roughening is performed on the surface of each of the first component 80a and the second component 80b and each upper surface of the planar portions 81a and 81b. The planar portions 81a and 81b of the first component 80a and the second component 80b are arranged to project alternately from the side surface side of the mounting stage 14 and the side surface side of the chamber 12 with an interval in the gas flow direction in the exhaust passage 51. In the present embodiment, the planar portion 81a is arranged to project from the side surface (the inner surface of the side wall 12a) of the chamber 12, and the planar portion 81b is arranged to project from the side surface side of the mounting stage 14 with a predetermined interval below the planar portion 81a. The first component 80a and the second component 80b form a labyrinth structure by overlapping the tip portions of the planar portions 81a and 81b with an interval in the gas flow direction in the exhaust passage 51. The gas in the chamber 12 flows through the exhaust passage 51 while passing through the curved flow path between the first component 80a and the second component 80b, and is exhausted from the exhaust hole 12h.

The first adsorption member 80 is provided around the entire circumference of the mounting stage 14. In the present embodiment, the first component 80a is provided on the entire circumference of the side surface of the chamber (the inner surface of the side wall 12a) facing the side surface of the mounting stage 14. The second component 80b is provided on the entire circumference of the side surface of the mounting stage 14. Incidentally, the first component 80a and the second component 80b do not necessarily have to be provided on the outer periphery of the mounting stage 14 and may not be arranged at a part of the periphery of the mounting stage 14 in order to secure an arrangement area for other components, for example.

The first adsorption member 80 is detachably provided on the inner wall surface of the exhaust passage 51. In the present embodiment, the first component 80a is detachably fixed to the side surface of the chamber 12 (the inner surface of the side wall 12a) by a fixture such as a bolt, and the second component 80b is detachably fixed to the side surface of the mounting stage 14 by a fixture such as a bolt.

At least the area, which faces the tip of the planar portion of the first adsorption member 80, of the inner wall surface of the exhaust passage 51 is arranged with a second adsorption member 82. In the present embodiment, in the first component 80a and the second component 80b, the second adsorption member 82 is arranged on the inner wall surface of the exhaust passage 51 on the side surface side of the processing container 12, so as to cover the area which is positioned on the most downstream side in the gas flow direction in the exhaust passage 51 and in which the second component 80b faces the tip of the planar portion 81b. The second adsorption member 82 extends in the gas flow direction in the exhaust passage 51 along the inner wall surface of the exhaust passage 51. The surface of the second adsorption member 82 is roughened similarly to the surface of the first adsorption member 80.

The second adsorption member 82 is detachably provided on the inner wall surface of the exhaust passage 51 similarly to the first adsorption member 80. The second adsorption member 82 may be detachably provided on the first adsorption member 80.

The plasma processing apparatus 1 further includes a controller 100. The controller 100 integrally controls each unit of the plasma processing apparatus 1. The controller 100 may include a processor such as a CPU, a user interface, and a storage.

The processor integrally controls each unit such as the microwave output device 16, the mounting stage 14, the gas supply system 38, and the exhaust device 56 by executing the program and the process recipe stored in the storage.

The user interface includes a keyboard or a touch panel through which a process manager inputs commands to manage the plasma processing apparatus 1, a display which visualizes and displays the operating status of the plasma processing apparatus 1, and the like.

The storage stores a control program (software) for realizing various processes executed by the plasma processing apparatus 1 by controlling the processor, a process recipe including processing condition data and the like, and the like. The processor calls various control programs such as instructions from the user interface from the storage as necessary and executes the programs. Under the control of such a processor, desired processing is executed in the plasma processing apparatus 1.

Next, the processing operation when performing the plasma process (for example, plasma etching) on the wafer W by using the plasma processing apparatus 1 configured as described above will be described.

First, the plasma processing apparatus 1 opens a gate valve (not illustrated) provided in the chamber 12. The wafer W is loaded into the chamber 12 by a transfer mechanism (not illustrated) and placed on the mounting stage 14. The plasma processing apparatus 1 holds the wafer W on the mounting stage 14 by the electrostatic chuck 14c. Next, the plasma processing apparatus 1 supplies the processing gas from the gas supply system 38 into the chamber 12 through the conduit 36, the injector 41, and the through hole 20h of the dielectric window 20. Further, the plasma processing apparatus 1 evacuates the inside of the chamber 12 by the exhaust device 56 to maintain the inner pressure of the chamber 12 at the set value.

Subsequently, the plasma processing apparatus 1 causes the microwave output device 16 to generate microwaves, and supplies the generated microwaves to the antenna 18 through the waveguide 21 and the coaxial waveguide 28. Further, the plasma processing apparatus 1 applies a high frequency power of a predetermined frequency as a bias high frequency from the high frequency power supply 58 to the mounting stage 14. As a result, the microwaves are radiated into the chamber 12 through the antenna 18, and plasma of the processing gas is generated in the chamber 12. Ions in the plasma are drawn toward the wafer W by the bias high frequency. As a result, the plasma process is performed on the wafer W, for example, plasma etching is performed on the film of the wafer W.

Figure 2:
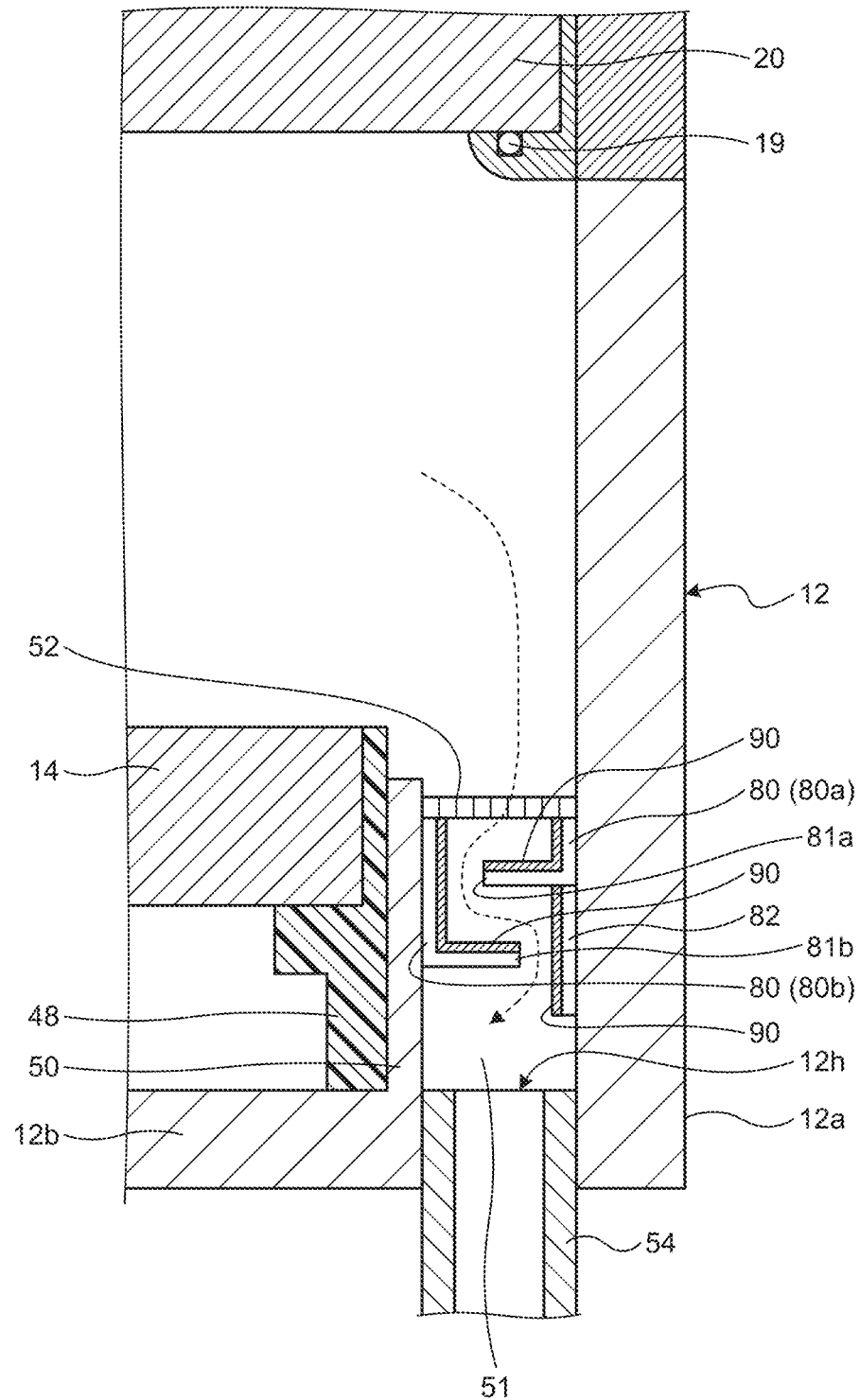
FIG. 2 is a diagram illustrating an example of a gas flow in an exhaust passage according to the first embodiment.

Incidentally, when the wafer W is subjected to the plasma process, by-products may be released. For example, when an etching process by plasma is performed on the wafer W containing metal, a by-product containing metal is released. The gas containing the released by-product is sucked by the exhaust device 56 and flows through the exhaust passage 51 provided around the mounting stage 14 to reach the exhaust hole 12h, thereby being exhausted from the exhaust hole 12h through the exhaust pipe 54. FIG. 2 is a diagram illustrating an example of a gas flow in the exhaust passage 51 according to the first embodiment. In FIG. 2, an example of the gas flow in the exhaust passage 51 is schematically illustrated by a dashed arrow. The gas containing by-products flows through the exhaust passage 51 toward the exhaust hole 12h while passing through the S-shaped curved flow path between the first component 80a and the second component 80b.

In the plasma processing apparatus 1 according to the present embodiment, the first adsorption member 80 which is configured by the first component 80a and the second component 80b of which surfaces are roughened to adsorb by-products is arranged along the inner wall surface of the exhaust passage 51. For example, the surface of the first adsorption member 80 has the planar portions 81a and 81b which protrude in a direction intersecting the gas flow in the exhaust passage 51, and the roughening is performed on the surface of each of the first component 80a and the second component 80b and the upper surface of the planar portions 81a and 81b. In the present embodiment, the surface of each of the first component 80a and the second component 80b and the upper surface of each of the planar portions 81a and 81b are subjected to thermal spraying as roughening. FIG. 2 illustrates a sprayed film 90 which is formed by performing thermal spraying on the surface of each of the first component 80a and the second component 80b and the upper surface of each of the planar portions 81a, 81b. The sprayed film 90 has a rough surface and therefore has a property of adhering by-products. Examples of the material of the sprayed film 90 include Y2O3 or YF3. When the first adsorption member 80 is arranged along the inner wall surface of the exhaust passage 51, the by-product generated by the plasma process can be captured by the sprayed film 90 on the first component 80a and the second component 80b. That is, the gas containing the by-product generated by the plasma process flows through the exhaust passage 51 provided around the mounting stage 14 toward the exhaust hole 12h by the suction of the exhaust device 56. The by-products contained in the gas flowing through the exhaust passage 51 come into contact with and are captured by the sprayed film 90 on the first component 80a and the second component 80b, thereby suppressing the adhesion of the by-product to the inner wall surface of the exhaust passage 51.

The sprayed film 90 is preferably formed to have a surface roughness large enough to capture by-products. However, in a case where the surface roughness of the sprayed film 90 is excessively large, the number of particles released from the sprayed film 90 increases excessively. In this regard, it is preferable that the sprayed film 90 has a surface roughness at which the rate of increase in the number of released particles falls within a predetermined allowable value. The surface roughness at which the rate of increase in the number of released particles falls within the allowable value differs depending on the material type of the sprayed film 90.

Figure 3:
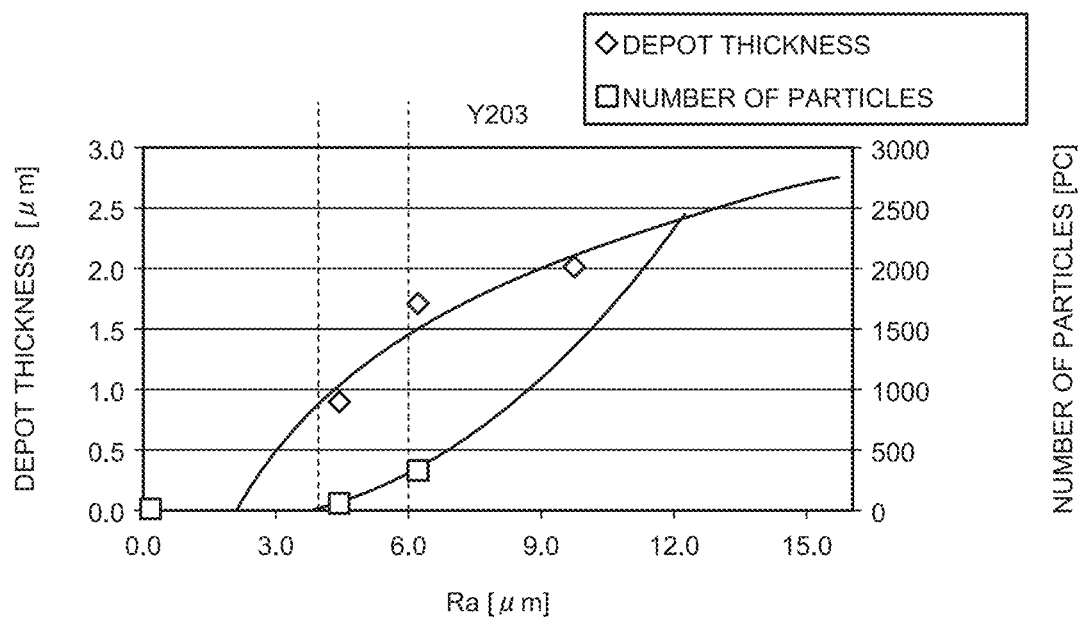
FIG. 3 is a diagram illustrating an example of measurement results of a relationship between a surface roughness Ra of a sprayed film, a thickness of a depot, and the number of particles released from the sprayed film.

FIG. 3 is a diagram illustrating an example of measurement results of a relationship between a surface roughness Ra of the sprayed film 90, the thickness of the by-product (hereinafter, referred to as "depot") captured in the sprayed film 90, and the number of particles released from the sprayed film 90. FIG. 3 illustrates the measurement result of the surface roughness Ra of the sprayed film 90, the thickness of the depot, and the number of particles in a case where the material of the sprayed film 90 is Y2O3. In a case where the material of the sprayed film 90 is Y2O3, the surface roughness Ra at which the rate of increase in the number of particles released from the sprayed film 90 falls within the allowable value is within the range of 4 μm to 6 μm.

Figure 4:
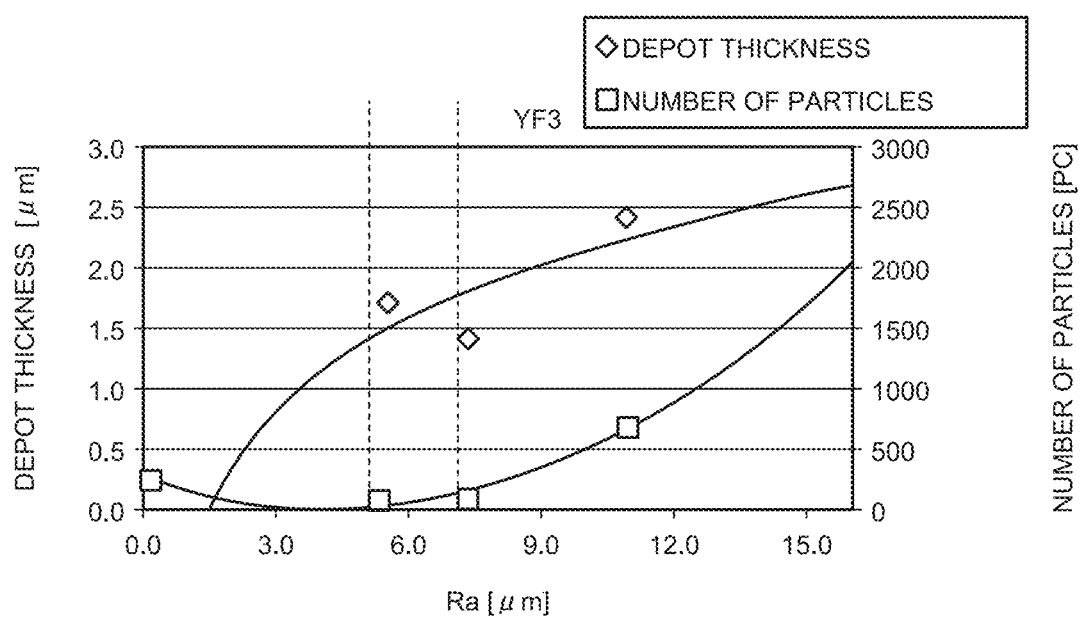
FIG. 4 is a diagram illustrating another example of the measurement results of the relationship between the surface roughness Ra of the sprayed film, the thickness of the depot, and the number of particles released from the sprayed film.

FIG. 4 is a diagram illustrating another example of the measurement results of the relationship between the surface roughness Ra of the sprayed film 90, the thickness of the depot, and the number of particles released from the sprayed film 90. FIG. 3 illustrates the measurement result of the surface roughness Ra of the sprayed film 90, the thickness of the depot, and the number of particles in a case where the material of the sprayed film 90 is YF3. In a case where the material of the sprayed film 90 is YF3, the surface roughness Ra at which the rate of increase in the number of particles released from the sprayed film 90 falls within the allowable value is within the range of 5 µm to 7 µm.

The description returns to FIG. 2. In the plasma processing apparatus 1 according to the present embodiment, the second adsorption member 82 having the roughened surface is arranged in the area, which faces the tip of the planar portion 81b of the second component 80b, in the inner wall surface of the exhaust passage 51. In the present embodiment, the surface of the second adsorption member 82 is subjected to thermal spraying as roughening. FIG. 2 illustrates the sprayed film 90 formed by performing thermal spraying on the surface of the second adsorption member 82. The sprayed film 90 has a rough surface and therefore has a property of adhering by-products. Examples of the material of the sprayed film 90 include Y2O3 or YF3. When the second adsorption member 82 is arranged in the area, which faces the tip of the planar portion 81b of the second component 80b, in the inner wall surface of the exhaust passage 51, the by-products contained in the gas flowing out from the flow path between the first component 80a and the second component 80b can be captured by the sprayed film 90 on the second adsorption member 82. That is, when the gas containing by-products passes through the flow path between the first component 80a and the second component 80b and flows out from the tip side of the planar portion 81b of the second component 80b, the by-products come into contact with and are captured by the sprayed film 90 on the second adsorption member 82. As a result, the adhesion of by-products to the inner wall surface of the exhaust passage 51 is further suppressed.

Figure 5:
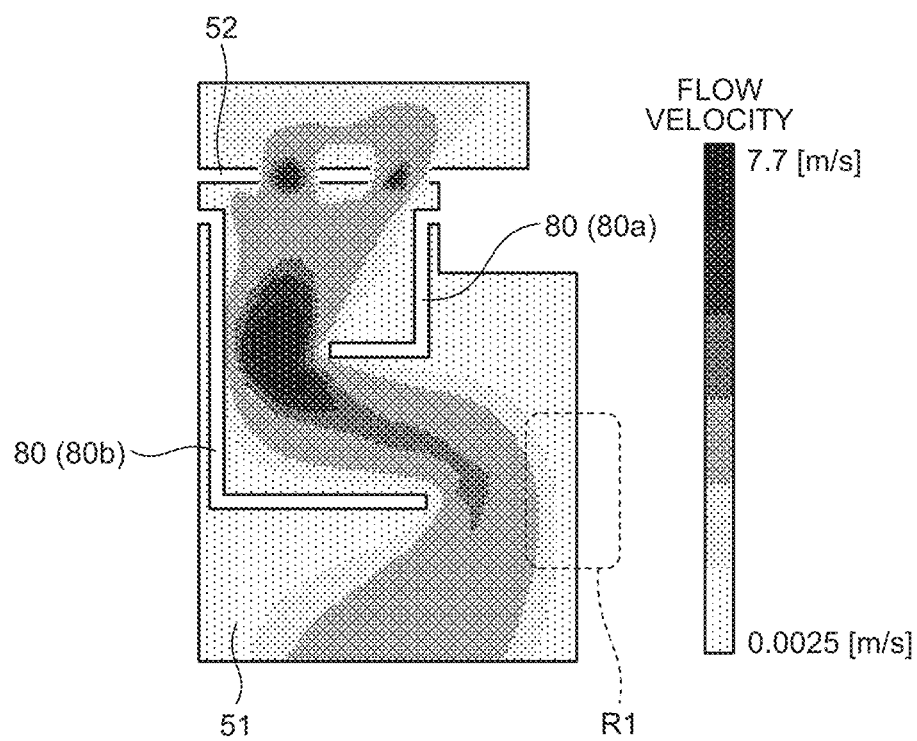
FIG. 5 is a diagram illustrating an example of a simulation result of a flow velocity distribution of a gas flow when no second adsorption member is provided in the first embodiment.

Here, an example of a simulation result of a flow velocity distribution of the gas flow in a case where no second adsorption member 82 is provided will be described. FIG. 5 is a diagram illustrating an example of the simulation result of the flow velocity distribution of the gas flow when no second adsorption member 82 is provided in the first embodiment. In the example of FIG. 5, the second adsorption member 82 is not arranged on the inner wall surface of the exhaust passage 51. The gas containing by-products passes through the flow path between the first component 80a and the second component 80b and flows out to an area R1, which is positioned on the most downstream side in the gas flow direction in the exhaust passage 51 and faces the tip of the planar portion 81b of the second component 80b, in the inner wall surface of the exhaust passage 51, so as to be collected in the area R1. On the other hand, in the present embodiment, the second adsorption member 82 having the surface formed with the sprayed film 90 is arranged in the area R1, which faces the tip of the planar portion 81b of the second component 80b, in the inner wall surface of the exhaust passage 51. Accordingly, when the gas containing the by-product flows out from the flow path between the first component 80a and the second component 80b to the area R1 facing the tip of the planar portion 81b of the second component 80b, the by-product can be efficiently captured by the second adsorption member 82.

Figure 6:
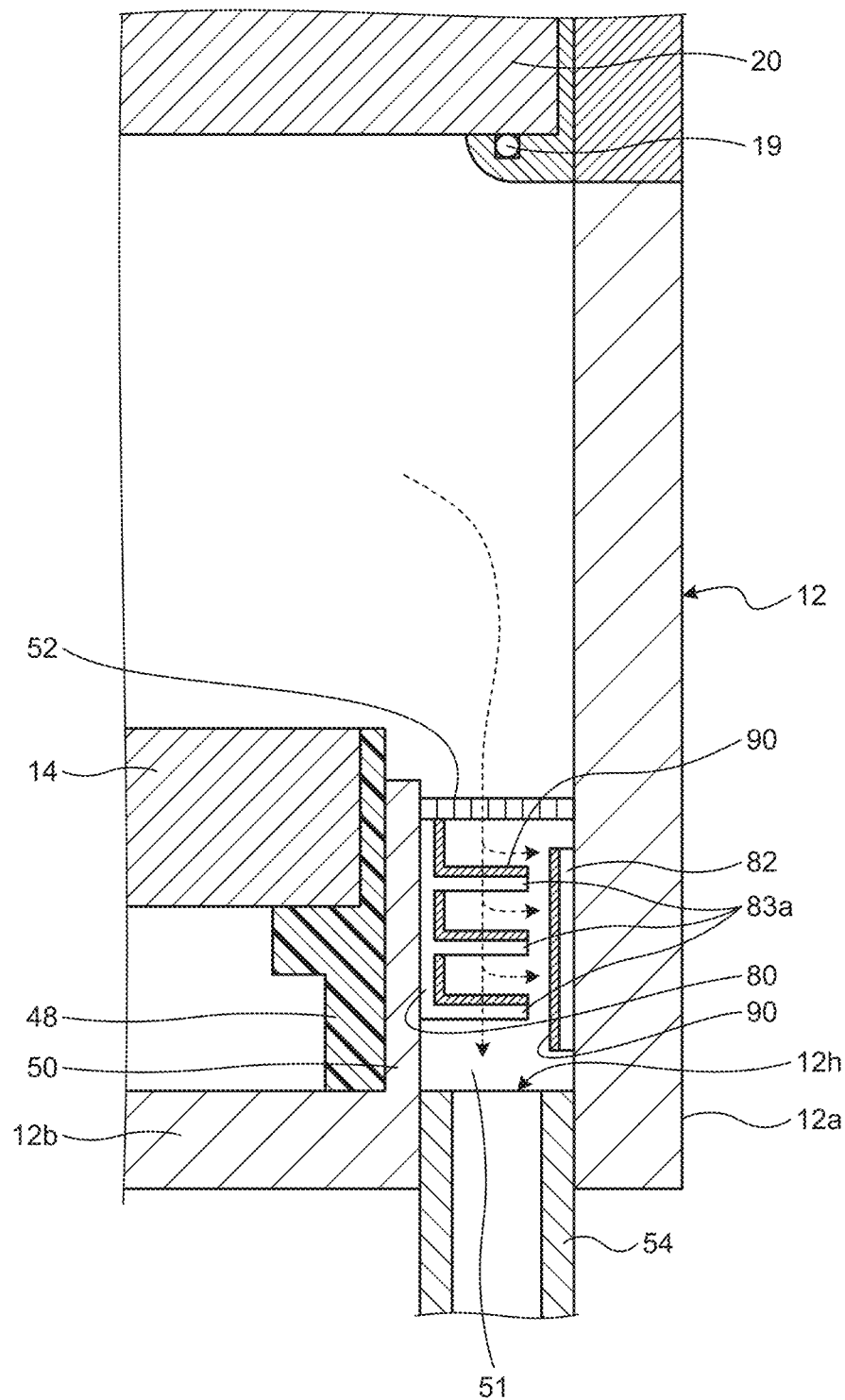
FIG. 6 is a diagram illustrating an example of another configuration of the plasma processing apparatus according to the first embodiment.

Incidentally, in the present embodiment, a case is described in which the first adsorption member 80 configured by two components is arranged along the inner wall surface of the exhaust passage 51 on the side surface side of the mounting stage 14 and the inner wall surface on the side surface side of the processing container 12. However, the number of components configuring the first adsorption member 80 may be one. That is, the first adsorption member 80 configured by one component may be arranged along the inner wall surface of the exhaust passage 51 on the side surface side of the mounting stage 14 or the inner wall surface on the side surface side of the processing container 12. Further, in a case where the number of the first adsorption members 80 is one, a plurality of mesh-shaped planar portions may be provided on the surface of the first adsorption member 80. FIG. 6 is a diagram illustrating an example of another configuration of the plasma processing apparatus 1 according to the first embodiment. In FIG. 6, an example of the gas flow in the exhaust passage 51 is schematically illustrated by a dashed arrow. FIG. 6 illustrates a case where one first adsorption member 80 is arranged on the inner wall surface of the exhaust passage 51 on the side surface side of the mounting stage 14. In the first adsorption member 80, a plurality of planar portions 83a are provided on the surface thereof at intervals in the gas flow direction in the exhaust passage 51. Each of the plurality of planar portions 83a has a mesh shape that allows the gas to pass therethrough and allows the gas to disperse in a direction intersecting the gas flow direction in the exhaust passage 51. The surface of the first adsorption member 80 and the upper surface of each of the plurality of planar portions 83a are subjected to thermal spraying as roughening. FIG. 6 illustrates the sprayed film 90 which is formed by performing thermal spraying on the surface of the first adsorption member 80 and the upper surface of each of the plurality of planar portions 83a. When a plurality of mesh-shaped planar portions 83a are provided on the surface of the first adsorption member 80, the by-products generated by the plasma process can be captured by the sprayed film 90 on the plurality of planar portions 83a. That is, the gas containing by-products flows through the exhaust passage 51 provided around the mounting stage 14 toward the exhaust hole 12h by the suction of the exhaust device 56. The by-products contained in the gas flowing through the exhaust passage 51 come into contact with and are captured by the sprayed film 90 on the plurality of planar portions 83a, thereby suppressing the adhesion of the by-product to the inner wall surface of the exhaust passage 51.

The second adsorption member 82 having the roughened surface is arranged in the area, which faces the tips of the plurality of planar portions 83a of the first adsorption member 80, in the inner wall surface of the exhaust passage 51. The surface of the second adsorption member 82 is subjected to thermal spraying as roughening. FIG. 6 illustrates the sprayed film 90 formed by performing thermal spraying on the surface of the second adsorption member 82. When the second adsorption member 82 is arranged in the area, which faces the tips of the plurality of planar portions 83a of the first adsorption member 80, in the inner wall surface of the exhaust passage 51, the by-products contained in the gas dispersed in each of the plurality of planar portions 83a can be captured by the sprayed film 90 on the second adsorption member 82. That is, when the gas containing by-products collides with each of the plurality of planar portions 83a, and is dispersed toward the area, which faces the tips of the plurality of planar portions 83a, in the inner wall surface of the exhaust passage 51, the by-products come into contact with and are captured by the sprayed film 90 on the second adsorption member 82. As a result, the adhesion of by-products to the inner wall surface of the exhaust passage 51 is further suppressed.

As described above, the plasma processing apparatus according to the present embodiment includes the processing container, the exhaust passage, and the first adsorption member. The mounting stage on which the substrate is mounted is provided inside the processing container, and the plasma process is performed on the substrate. The exhaust passage is provided around the mounting stage, and the gas containing the by-products released by the plasma process flows therethrough. The first adsorption member is arranged along the inner wall surface of the exhaust passage, and the surface thereof is roughened to adsorb by-products. Accordingly, the plasma processing apparatus can capture the by-product contained in the gas flowing through the exhaust passage with the first adsorption member and suppress the adhesion of the by-product to the inner wall surface of the exhaust passage.

In the plasma processing apparatus, the surface of the first adsorption member has a planar portion which protrudes in a direction intersecting the gas flow in the exhaust passage, and the roughening is performed on the surface and the surface of the exhaust passage of the planar portion on the upstream side in the gas flow direction. Accordingly, the plasma processing apparatus can capture the by-product contained in the gas flowing through the exhaust passage with the surface and the planar portion of the first adsorption member while causing the gas to collide with the planar portion of the first adsorption member and suppress the adhesion of the by-product to the inner wall surface of the exhaust passage.

In the plasma processing apparatus, the plurality of first adsorption members are arranged along the inner wall surface of the exhaust passage on the side surface side of the mounting stage and the inner wall surface on the side surface side of the processing container. Further, the planar portions of the plurality of first adsorption members are arranged to project alternately from the side surface side of the mounting stage and the side surface side of the processing container with an interval in the gas flow direction in the exhaust passage. Accordingly, the plasma processing apparatus can capture the by-product contained in the gas flowing through the exhaust passage with the plurality of first adsorption members while passing through the curved flow path curved between the pluralities of first adsorption members and suppress the adhesion of the by-product to the inner wall surface of the exhaust passage.

In the plasma processing apparatus, the plurality of planar portions are provided on the surface of the first adsorption member at intervals in the gas flow direction in the exhaust passage. Further, each of the plurality of planar portions has a mesh shape that allows the gas to pass therethrough and allows the gas to disperse in a direction intersecting the gas flow direction in the exhaust passage. Accordingly, the plasma processing apparatus can capture the by-product contained in the gas flowing through the exhaust passage with the plurality of planar portions of the first adsorption member while causing the gas to collide with the plurality of planar portions of the first adsorption member and suppress the adhesion of the by-product to the inner wall surface of the exhaust passage.

The plasma processing apparatus further includes the second adsorption member which is arranged in at least the area, which faces the tip of the planar portion of the first adsorption member, in the inner wall surface of the exhaust passage and has the roughened surface. Accordingly, when the gas containing the by-product flows out from the tip side of the planar portion of the first adsorption member, the plasma processing apparatus can capture the by-product with the second adsorption member and suppress the adhesion of the by-product to the inner wall surface of the exhaust passage.

In the plasma processing apparatus, the first adsorption member is provided around the entire circumference of the mounting stage. Accordingly, the plasma processing apparatus can capture the by-product contained in the gas flowing through the exhaust passage in the entire circumference of the mounting stage with the first adsorption member and suppress the adhesion of the by-product to the inner wall surface of the exhaust passage.

In the plasma processing apparatus, the first adsorption member is provided detachably on the inner wall surface of the exhaust passage. Accordingly, the plasma processing apparatus can easily replace the first adsorption member to which the by-product is attached and can improve the maintainability.

In the plasma processing apparatus, the second adsorption member is provided detachably on the inner wall surface of the exhaust passage. Accordingly, the plasma processing apparatus can easily replace the second adsorption member to which the by-product is attached and can improve the maintainability.

In the plasma processing apparatus, the roughening is thermal spraying, blasting, or laser processing. Accordingly, the plasma processing apparatus can improve the adhesiveness with the by-product and can suppress the peeling of the by-product.

Second Embodiment

Next, a second embodiment will be described. The second embodiment relates to variations of the first adsorption member and the second adsorption member of the first embodiment.

Figure 7:
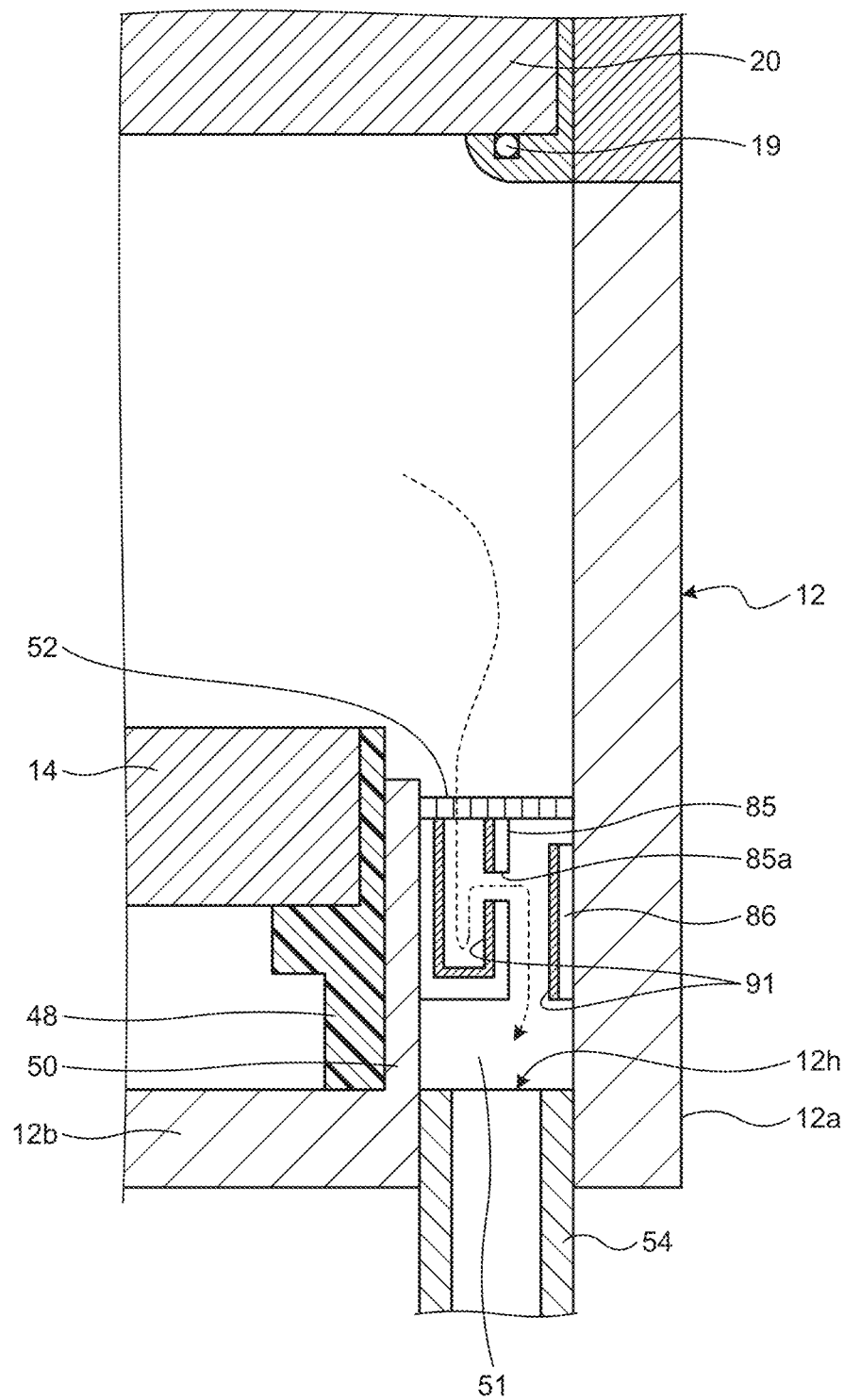
FIG. 7 is a diagram illustrating an example of a configuration of a plasma processing apparatus according to a second embodiment.

FIG. 7 is a diagram illustrating an example of the configuration of the plasma processing apparatus 1 according to the second embodiment. In FIG. 7, an example of the gas flow in the exhaust passage 51 is schematically illustrated by a dashed arrow. As illustrated in FIG. 7, in the exhaust passage 51, a first adsorption member 85 is arranged along the inner wall surface of the exhaust passage 51. In the present embodiment, the first adsorption member 85 is arranged along the inner wall surface of the exhaust passage 51 on the side surface side of the mounting stage 14. The first adsorption member 85 is formed in a bottomed box shape having an opening at the top, and a through hole 85a which penetrates in the direction intersecting the gas flow in the exhaust passage 51 is formed on the side wall on the side apart from the inner wall surface of the exhaust passage 51. The inner surface of the first adsorption member 85 is roughened to adsorb by-products. Examples of roughening include thermal spraying, blasting, and laser processing. In the present embodiment, the inner surface of the first adsorption member 85 is subjected to thermal spraying as roughening. FIG. 7 illustrates a sprayed film 91 formed by performing thermal spraying on the inner surface of the first adsorption member 85. The material and surface roughness of the sprayed film 91 are the same as the material and surface roughness of the sprayed film 90. When the first adsorption member 85 is arranged along the inner wall surface of the exhaust passage 51, the by-product generated by the plasma process can be captured by the sprayed film

91 on the inner surface of the first adsorption member 85. That is, the gas containing the by-product generated by the plasma process flows through the exhaust passage 51 provided around the mounting stage 14 toward the exhaust hole 12*h* by the suction of the exhaust device 56. The gas flowing through the exhaust passage 51 enters the inner space of the first adsorption member 85 from the opening of the first adsorption member 85, and the by-product contained in the gas come into contact with and are captured by the sprayed film 91 on the inner surface of the first adsorption member 85. As a result, the adhesion of by-products to the inner wall surface of the exhaust passage 51 is suppressed.

In the plasma processing apparatus 1 according to the present embodiment, a second adsorption member 86 having a roughened surface is arranged in the area, which faces the through hole 85*a* of the side wall of the first adsorption member 85, in the inner wall surface of the exhaust passage 51. Examples of roughening include thermal spraying, blasting, and laser processing. In the present embodiment, the surface of the second adsorption member 86 is subjected to thermal spraying as roughening. FIG. 7 illustrates the sprayed film 91 formed by performing thermal spraying on the surface of the second adsorption member 86. When the second adsorption member 86 is arranged in the area, which faces the through hole 85*a* of the side wall of the first adsorption member 85, in the inner wall surface of the exhaust passage 51, the by-products contained in the gas flowing out from the through hole 85*a* in the side wall of the first adsorption member 85 can be captured by the sprayed film 91 on the second adsorption member 86. That is, the gas flowing through the exhaust passage 51 enters the inner space of the first adsorption member 85 and flows out from the through hole 85*a* in the side wall of the first adsorption member 85, the by-product contained in the gas come into contact with and are captured by the sprayed film 91 on the second adsorption member 86. As a result, the adhesion of by-products to the inner wall surface of the exhaust passage 51 is further suppressed.

Figure 8:
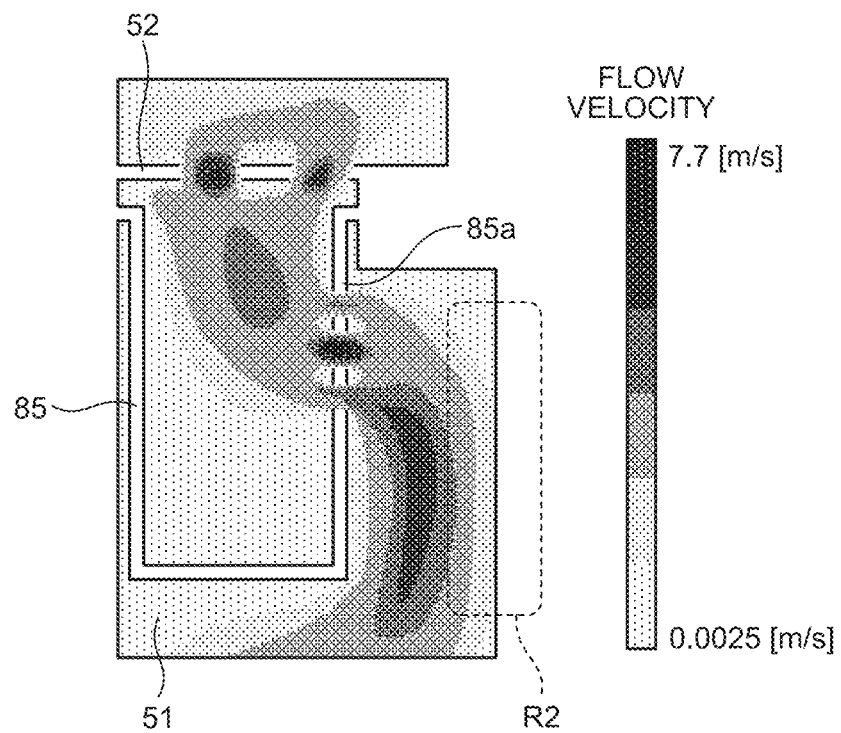
FIG. 8 is a diagram illustrating an example of a simulation result of a flow velocity distribution of a gas flow when no second adsorption member is provided in the second embodiment.

Here, an example of the simulation result of the flow velocity distribution of the gas flow in a case where no second adsorption member 86 is provided will be described. FIG. 8 is a diagram illustrating an example of the simulation result of the flow velocity distribution of the gas flow when no second adsorption member 86 is provided in the second embodiment. In the example of FIG. 8, the second adsorption member 86 is not arranged on the inner wall surface of the exhaust passage 51. Further, in the example of FIG. 8, three through holes 85*a* are formed in the side wall of the first adsorption member 85. After entering the space inside the first adsorption member 85, the gas containing by-products flows out from the through hole 85*a* of the side wall of the first adsorption member 85 toward the area R2, which faces the through hole 85*a* of the side wall of the first adsorption member 85, in the inner wall surface of the exhaust passage 51 and is collected in the area R2. On the other hand, in the present embodiment, the second adsorption member 86 having the surface formed with the sprayed film 91 is arranged in the area, which faces the through hole 85*a* of the side wall of the first adsorption member 85, in the inner wall surface of the exhaust passage 51. Accordingly, when the gas containing the by-product flows out from the through hole 85*a* on the side wall of the first adsorption member 85 to the area R2 facing the through hole 85*a*, the by-product can be efficiently captured by the second adsorption member 86.

As described above, in the plasma processing apparatus according to the present embodiment, the first adsorption member is arranged along the inner wall surface of the exhaust passage and is formed in a bottomed box shape having an opening at the top. Then, in the first adsorption member, the through hole which penetrates in the direction intersecting the gas flow in the exhaust passage is formed on the side wall on the side apart from the inner wall surface of the exhaust passage. Then, the inner surface of the first adsorption member is roughened to adsorb by-products. Accordingly, the plasma processing apparatus can capture the by-product contained in the gas flowing through the exhaust passage with the first adsorption member and suppress the adhesion of the by-product to the inner wall surface of the exhaust passage.

The plasma processing apparatus further includes the second adsorption member which is arranged in at least the area, which faces the through hole of the side wall of the first adsorption member, in the inner wall surface of the exhaust passage and has the roughened surface. Accordingly, when the gas containing the by-product flows out from the through hole of the side wall of the first adsorption member, the plasma processing apparatus can capture the by-product with the second adsorption member and suppress the adhesion of the by-product to the inner wall surface of the exhaust passage.

Incidentally, the embodiments as set forth hereinabove are considered in all respects as illustrative only and not restrictive. The above-described embodiments may be omitted, replaced, or modified in various forms without departing from the scope and spirit of the appended claims.

In the above-described embodiment, the plasma processing apparatus 1 which performs processing such as etching on the substrate by using microwave plasma as a plasma source has been described as an example, but the disclosed technology is not limited to this. The plasma processing apparatus may be an apparatus which performs processing on a substrate by using plasma, and the plasma source is not limited to the microwave plasma. As a plasma source other than the microwave plasma, any plasma source such as inductively coupled plasma, capacitively coupled plasma, or magnetron plasma can be used.

According to the present disclosure, it is possible to suppress the adhesion of by-products to the inner wall surface of the exhaust passage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
  a processing container in which a mounting stage mounted with a substrate is provided and a plasma process is performed on the substrate;
  an exhaust passage which is provided around the mounting stage and through which a gas containing a by-product released by the plasma process flows; and
  a first adsorption member which is arranged along an inner wall surface of the exhaust passage and is formed in a bottomed box shape having an opening at a top, in which a through hole which penetrates in a direction intersecting a gas flow in the exhaust passage is formed on a side wall on a side apart from the inner wall surface of the exhaust passage, and an inner surface of which is roughened more than the inner wall surface of the exhaust passage to adsorb the by-product.

2. The plasma processing apparatus according to claim 1, further comprising:
 a second adsorption member which is arranged in at least an area, which faces the through hole of the side wall of the first adsorption member, in the inner wall surface of the exhaust passage and has a roughened surface.

3. The plasma processing apparatus according to claim 1, wherein
 the first adsorption member is provided around an entire circumference of the mounting stage.

4. The plasma processing apparatus according to claim 1, wherein
 the first adsorption member is provided detachably on the inner wall surface of the exhaust passage.

5. The plasma processing apparatus according to claim 2, wherein
 the second adsorption member is provided detachably on the inner wall surface of the exhaust passage.

6. The plasma processing apparatus according to claim 1, wherein
 the roughening is thermal spraying, blasting, or laser processing.

* * * * *